(12) United States Patent
Fournel et al.

(10) Patent No.: US 10,103,052 B2
(45) Date of Patent: Oct. 16, 2018

(54) METHOD FOR MANUFACTURING A STRUCTURE BY DIRECT BONDING

(71) Applicant: COMMISSARIAT A L'ENERGIE ATOMIQUE ET AUX ENERGIES ALTERNATIVES, Paris (FR)

(72) Inventors: Frank Fournel, Villard-Bonnot (FR); Chloé Martin-Cocher, Fontaine (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/758,740

(22) PCT Filed: Jan. 22, 2014

(86) PCT No.: PCT/FR2014/050116
§ 371 (c)(1),
(2) Date: Jun. 30, 2015

(87) PCT Pub. No.: WO2014/114876
PCT Pub. Date: Jul. 31, 2014

(65) Prior Publication Data
US 2015/0340278 A1   Nov. 26, 2015

(30) Foreign Application Priority Data
Jan. 22, 2013   (FR) ...................... 13 50568

(51) Int. Cl.
*H01L 21/44*   (2006.01)
*H01L 21/48*   (2006.01)
(Continued)

(52) U.S. Cl.
CPC .... *H01L 21/76251* (2013.01); *H01L 21/2007* (2013.01); *H01L 29/06* (2013.01)

(58) Field of Classification Search
CPC ............... H01L 21/76251; H01L 29/06; H01L 21/2007; H01L 23/3142; H01L 23/52223;
(Continued)

(56) References Cited

U.S. PATENT DOCUMENTS 5,407,856 A * 4/1995 Quenzer ............... H01L 21/187
148/DIG. 12
2005/0287767 A1   12/2005 Dantz et al.
(Continued)

FOREIGN PATENT DOCUMENTS

WO    03010806 A2    2/2003
WO    2012100786 A1   8/2012

OTHER PUBLICATIONS

Mar. 24, 2014 Written Opinion Issued in International Patent Application No. PCT/FR2014/050116.
(Continued)

*Primary Examiner* — Kimberly Rizkallah
*Assistant Examiner* — Dilinh Nguyen
(74) *Attorney, Agent, or Firm* — Oliff PLC

(57) ABSTRACT

The method includes the steps of: a) providing first and second layers, each including a bonding surface, at least one of said layers including recesses and the bonding surface of one of the two layers being formed at least partially of a silicon oxide film; b) bringing the bonding surfaces into contact with one another, such as to create a direct bonding interface; c) filling at least one recess with a fluid including water molecules; and d) applying a thermal budget such as to generate bond annealing. Further relating to a structure including a direct bonding interface between two bonding surfaces of two layers, the bonding surface of at least one of the layers being formed at least partially of a silicon oxide film, and the direct bonding interface includes recesses filled with a fluid including water molecules.

14 Claims, 3 Drawing Sheets

(51) Int. Cl.
*H01L 21/50* (2006.01)
*H01L 21/30* (2006.01)
*H01L 21/46* (2006.01)
*H01L 29/06* (2006.01)
*H01L 21/762* (2006.01)
*H01L 21/20* (2006.01)

(58) Field of Classification Search
CPC ......... H01L 23/53238; H01L 23/53252; H01L 23/53266; H01L 24/26; H01L 21/76256
USPC .................................. 438/118, 459; 257/618
See application file for complete search history.

(56) References Cited

U.S. PATENT DOCUMENTS

| | | | |
|---|---|---|---|
| 2006/0032582 A1* | 2/2006 | Chen | H01L 24/83 156/272.6 |
| 2006/0255341 A1* | 11/2006 | Pinnington | B82Y 20/00 257/79 |
| 2007/0155056 A1 | 7/2007 | Kang et al. | |
| 2010/0127390 A1* | 5/2010 | Barth | H01L 23/473 257/714 |

OTHER PUBLICATIONS

Mar. 24, 2014 International Search Report issued in International Application No. PCT/FR2014/050116.

\* cited by examiner

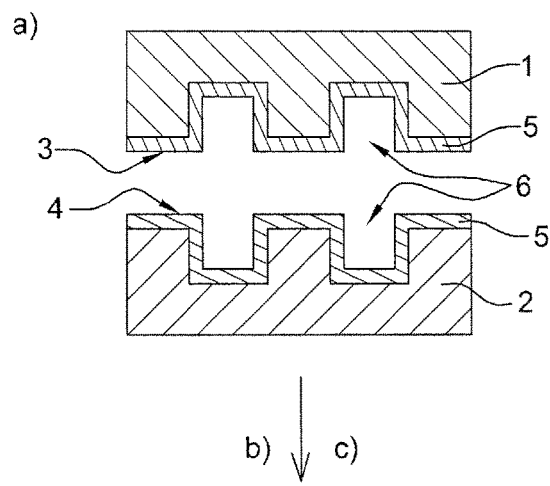
Fig. 5
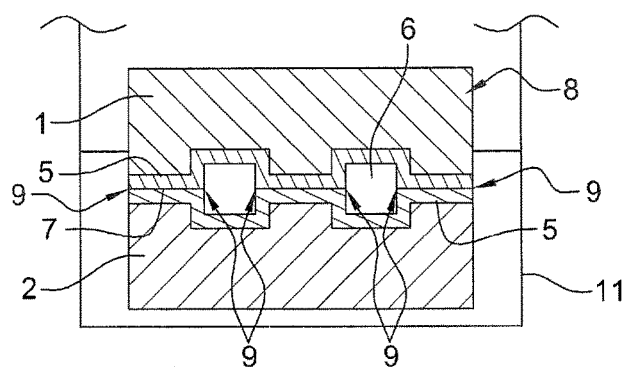
Fig. 6
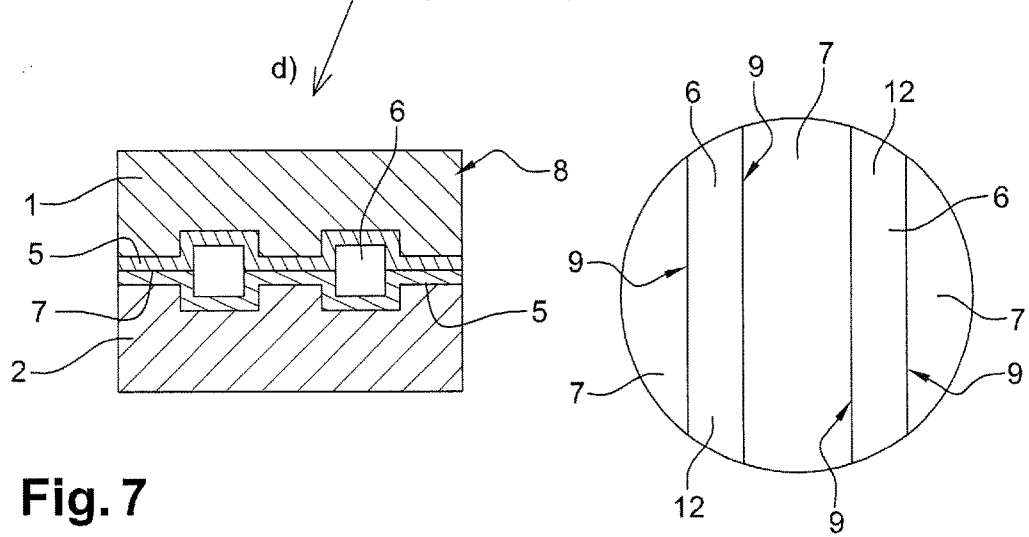
Fig. 7
Fig. 8

METHOD FOR MANUFACTURING A STRUCTURE BY DIRECT BONDING

The present invention concerns a method for manufacturing a structure by direct bonding of two layers of material presenting a high bonding energy. According to another aspect, the present invention concerns a structure comprising two layers of material brought into contact and adapted for a direct bonding with a high bonding energy.

Direct bonding is a bonding technique which is industrially used for many years in particular for the production of SOI (Silicon On Insulator) substrates. This technique consists in making two materials adhere without adding an adhesive material such as glue for example. By preparing the two surfaces well enough in terms of flatness, particulate contamination, hydrocarbon contamination, it is possible to bond directly two surfaces at ambient temperature and pressure.

However, bonding at ambient temperature, just after bringing the two surfaces into contact, results in a relatively low bonding energy, often lower than about 500 mJ/m$^2$. In order to increase the bonding energy, it is often necessary to perform a thermal anneal of the two surfaces brought into contact at temperatures higher than 200° C. for one to several hour(s). The bonding energy thereby obtained may then reach 4 J/m$^2$ as is the case for example when bonding a silicon surface with a silicon oxide surface. Thus, it is possible to treat the surfaces to be bonded with a plasma, for example a nitrogen plasma in the case of a silicon oxide surface, which allows reaching more quickly enhanced bonding energies for a same applied thermal budget.

Without the application of a thermal budget at high temperature and especially in the case where performing plasma treatments is not possible, it may however be difficult to obtain high bonding energies. It is the case for example when bonding two thermal oxide surfaces whose thermal anneal after contacting is performed at 200° C., the bonding energy remains around 1.5 J/m$^2$.

One of the aims of the present invention is to overcome one or several of these drawbacks. To this end, and according to a first aspect, the invention concerns a method for manufacturing a structure by direct bonding between a first layer of material and a second layer of material, the method comprising the steps consisting of:

a) Providing the first and second layers each comprising a bonding surface, at least one of the first and second layers comprising recesses opening at the bonding surface of the at least one layer, and the bonding surface of at least one of the first and second layers being formed at least partially by a silicon oxide film, b) Bringing the bonding surfaces of the first and second layers into contact so as to provide the structure and create a direct bonding interface between the first and second layers, c) Filling at least partially at least one recess with a fluid comprising water molecules, and d) Applying a thermal budget at a temperature comprised between 20° C. and 400° C. enabling to perform a bonding anneal.

In this method, the presence of a silicon oxide film at the direct bonding interface and of water molecules in the proximity of the direct bonding interface allows realizing a direct bonding between two layers of material with a high bonding energy, without necessarily performing beforehand a plasma treatment of the surfaces to be bonded and while limiting the temperature of the thermal budget for the bonding anneal to low temperatures. Indeed, the presence of water molecules in the proximity of a direct bonding interface comprising silicon oxide enhances the bonding energy of the interface, and this even at a low anneal temperature. By the expression 'thermal budget', it is meant in the present document, the application of a determined temperature for a determined duration. By the expression 'low temperature', it is meant in the present document, a temperature ranging from the ambient temperature, around 20° C., to 400° C., preferably a temperature lower than or equal to 350° C. and still preferably a temperature lower than about 250° C., for example between 20° C. and 250° C. or between 50° C. and 200° C.

In the present document, it is understood that steps a), b), c) and d) are not systematically carried out successively in the stated order. According to the variants of the method, step c) may be in particular carried out prior to step b) of the method. It is the case in particular when the fluid is moisture-laden air.

The silicon oxide film may be a silicon dioxide film $SiO_2$ or a non-stoichiometric oxide film such as $SiO_x$.

The silicon oxide film may be a thermal oxide film formed by oxidation of a silicon material layer.

The silicon oxide film may be an oxide film deposited by one of the commonly used deposition techniques, such as CVD (Chemical Vapor Deposition).

According to one possibility, each of the first and second layers of material comprises recesses opening at their respective bonding surface.

At least one recess of the at least one of the first and second layers may form at least partially a recess with at least one recess of the other of the first and second layers when they are superimposed at the contacting moment according to step b) of the method.

According to a complementary arrangement, each of the first and second layers comprises a silicon oxide film at surface.

Advantageously, step a) of the method comprises a step of forming and arranging recesses in at least one of the first and second layers so that every point of the direct bonding interface is located at a distance smaller than or equal to a threshold distance from an edge of the direct bonding interface, the edges of the direct bonding interface being delimited, on the one hand by the recesses, and on the other hand by the periphery of the structure.

Thus, the size, the positioning and the number of recesses are determined so that the edges of the direct bonding interface, delimited by the recesses and the periphery of the structure, are spaced apart at a distance smaller than or equal to a determined threshold distance. This results in that every point of the direct bonding interface comprises silicon oxide and is proximate to an edge of the direct bonding interface, and if appropriate, to a source of water molecules. Consequently, every point of the direct bonding interface presents a high bonding energy even in the case of a bonding anneal performed at low temperature so that the whole interface where the direct bonding is implemented presents a high bonding energy.

Preferably, the formation of the recesses is realized by photolithography or by a machining technique, such as saw cut, so as to form recesses presenting dimensions comprised between 0.1 micrometer and 1 cm and preferably between 1 micrometer and 100 micrometers. These dimensions allow storing significant amounts of water required for reinforcing the bonding.

Advantageously, the method comprises a step i) carried out after step b) including setting up the structure in an enclosure comprising a fluid including water molecules.

Thus, the edge of the direct bonding interface formed by the periphery of the structure is in the vicinity of a wet atmosphere. In this variant, the recesses proximate to the periphery of the structure may be further from the periphery of the structure than in the previous embodiment while allowing each point of the direct bonding interface to be located at a distance smaller than or equal to the same threshold distance from water molecules.

According to one arrangement, at least one recess opens onto an outer face of the structure, thereby allowing to supply the direct bonding interface with water depending on the required amount.

According to one possibility, at least one recess extends substantially in a plane of the direct bonding interface so as to open onto a lateral edge of the structure adjacent to the plane of the direct bonding interface. Thus, said at least one recess communicates, in this case, with said medium of the enclosure. In this variant, step c) of the method, consisting of filling the recesses with a medium including water molecules, may be carried out by step i) of the method.

According to one possibility, the structure comprises a first series of recesses extending substantially in a plane of the direct bonding interface so as to open onto a lateral edge of the structure adjacent to the plane of the direct bonding interface.

According to one arrangement of the invention, at least one recess is hermetic in the structure. Said at least one hermetic recess is sealed and buried at the direct bonding interface with no communication with the exterior of the structure. Said at least one hermetic recess may be used for receiving electronic devices such as MEMS (Micro-Electro-Mechanical Systems).

According to one possibility, the structure comprises a second series of hermetic recesses.

According to another variant, the method comprises a step consisting of arranging at least one orifice through the thickness of said at least one of the first and second layers so as to connect at least one recess of said at least one layer to the opposite surface of the bonding surface of said at least one layer.

Advantageously, the method comprises, prior to step d), a step j) consisting of placing the structure at a temperature comprised between 20° C. and 99° C. for a duration comprised between 1 hour and 30 days. This heat treatment allows to accelerate the process allowing to obtain a high bonding energy at the direct bonding interface after application of the thermal budget of the bonding anneal step d). Indeed, this duration allows the water molecules to sufficiently penetrate the direct bonding interface in order to be consumed afterwards during the bonding anneal in an oxidation reaction reinforcing the bonding energy.

According to a particular arrangement, step c) comprises step j).

Preferably, the application of the thermal budget of step d) is carried out at a temperature lower than or equal to 350° C. and still preferably at a temperature lower than 200° C., for example between 20° C. and 200° C. or still between 50° C. and 150° C.

The application of the thermal budget is carried out for a duration comprised between a few minutes and several dozens of hours and preferably between a few dozens of minutes and a few hours.

The low temperature of the applied thermal budget allows to reduce the manufacturing costs. Moreover, using a low temperature allows bonding layers of materials having a significant thermal expansion coefficient difference. In addition, when the layers of materials include devices, the latter are not damaged by the used temperatures.

Advantageously, the method comprises, prior to step b) of brining the bonding surfaces into contact, a step consisting of applying a plasma treatment on the bonding surfaces of the first and second layers. Thus, it is possible to substantially reduce the temperature of the thermal budget while preserving a high bonding energy. In particular, it is possible to apply a thermal budget at ambient temperature (about 20° C.) for a duration comprised between about two hours and a few days.

According to one arrangement, said fluid comprising water molecules includes air comprising a relative moisture higher than 10% or water in the liquid form. These conditions allow permanently bringing enough water molecules into contact with the silicon oxide layer at the direct bonding interface in proportions that allow reinforcing the bonding energy. Another gaseous fluid, other than air, may be used, such as nitrogen for example, to the extent that the fluid comprises the same ratio of water molecules. Indeed, it is necessary that water molecules may come into contact with the direct bonding interface, that they may be consumed by silicon oxide and that the fluid is rich enough in water molecules in order to renew the presence of water molecules in contact with the interface.

Preferably, the threshold distance is comprised between 1.5 and 2.5 cm and still preferably the threshold distance is about 2 cm. Thus, when the points of the direct bonding interface are at about 2 cm from an edge of the interface in contact with said wet fluid, the bonding energy is significantly enhanced.

Concretely, the materials of the first layer and/or of the second layer are selected among silicon oxides, semiconductor materials, silicon nitrides, alumina, SiOC and diamond.

According to a second aspect, the invention concerns a structure comprising a direct bonding interface between two bonding surfaces respectively of a first layer and a second layer of material, the bonding surface of at least one of the first and second layers being formed at least partially by a silicon oxide film, and the direct bonding interface comprises recesses, at least one of the recesses being filled at least partially with a fluid comprising water molecules.

This structure allows, after bonding anneal, obtaining a high bonding energy at the points of the direct bonding interface located in the proximity of the edges of the direct bonding interface due to the presence of water molecules in the recesses delimiting the edges of the direct bonding interface.

Preferably, the recesses are arranged so that any point of the direct bonding interface is located at a distance smaller than or equal to a threshold distance comprised between 1.5 and 2.5 cm from an edge of the direct bonding interface, the edges of the direct bonding interface being delimited, on the one hand by the recesses, and on the other hand by the periphery of the structure.

Thus, the bonding energy is enhanced at every point of the direct bonding interface located at a distance smaller than or equal to a threshold distance from a recess filled with a fluid including water molecules.

According to one arrangement, at least one recess opens onto an outer face of the structure thereby allowing to supply the direct bonding interface with water depending on the required amount.

Advantageously, at least one recess extends substantially along a plane of the direct bonding interface so as to open onto a lateral edge of the structure adjacent to the plane of the direct bonding interface. Thus, filling the recess with a fluid including water molecules is facilitated by placing the structure in an enclosure comprising a medium including water molecules. Indeed, the thus provided through recesses may communicate with the external atmosphere of the structure.

According to another arrangement, at least one of the first or second layers comprises at least one orifice arranged through the thickness of said at least one of the first and second layers so as to connect at least one recess of said at least one layer to the opposite surface of the bonding surface of said at least one layer. Thus, the recess communicates with the external atmosphere of the structure which may include said medium including water molecules.

Preferably, the recesses present dimensions comprised between 0.1 micrometer and 1 cm and preferably between 1 micrometer and 100 micrometers so as to store significant amounts of water.

Concretely, the material of the first layer and of the second layer is included among silicon oxides, the semiconductor materials, silicon nitrides, alumina, SiOC and diamond.

Other aspects, aims and advantages of the present invention will appear better upon reading the following description of different variants thereof, given as non-limiting examples and made with reference to the appended drawings. The figures do not necessarily comply with the scale of all the represented elements in order to improve their readability. In the following description, for simplicity, identical, similar or equivalent elements of the different embodiments carry the same reference numerals.

FIGS. 5 to 7 represent a variant of the method according to the invention.

FIG. 8 illustrates a horizontal sectional view of a structure obtained according to an embodiment of the method of the invention.

Figure 1:
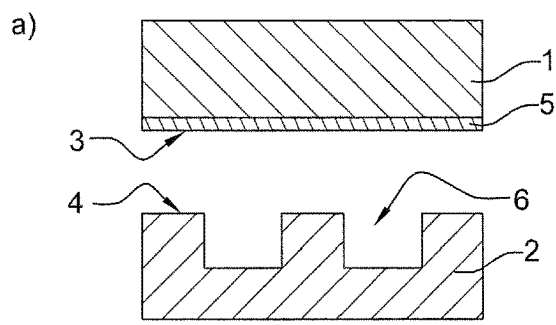
FIGS. 1 to 4 represent a cross-sectional view of the layers of material bonded by direct bonding according to an embodiment of the method according to the invention.

FIG. 1 illustrates a sectional view of a first layer 1 and a second layer 2 of material intended to be bonded by direct bonding according to the invention. The first and second layers 1, 2 present bonding surfaces 3, 4 disposed opposite to each other in order to prepare the contacting step b). The materials of the first and second layers 1, 2 may be constituted of oxidized materials, nitride materials or semiconductors. A silicon oxide film 5 is present at the bonding surface 3 of a flat first layer 1 and the second layer 2 presents recesses 6 opening at its bonding surface 4.

According to one arrangement which is not illustrated, the silicon oxide film 5 may be formed over a bonding surface 3, 4 recessed beforehand such as the surface 4 of the second layer 2 illustrated in FIG. 1. According to still another arrangement which is not illustrated, the silicon oxide film 5 may have been formed at a bonding surface 4 of the second layer 2 before the creation of the recesses 6 so that, after recessing, the film 5 does not cover the lateral walls of the layer 2, nor the bottom of the recesses 6 but covers only the bonding surface 4. As will be seen later in FIG. 5, the silicon oxide film 5 may also cover the bonding surfaces 3, 4 of the first and second layers 1, 2 of material.

Figure 2:
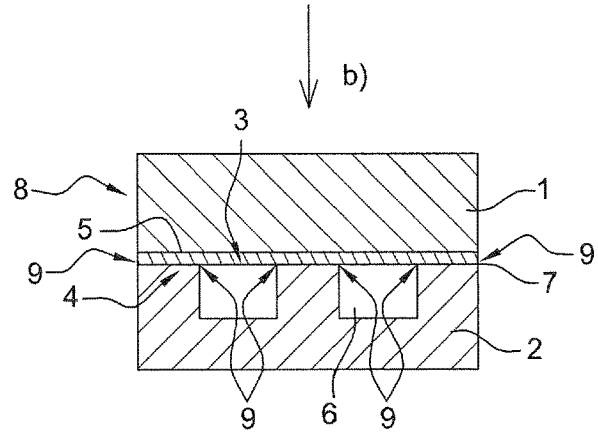

FIG. 2 illustrates the two bonding surfaces 3, 4 brought into contact so as to form the direct bonding surface 7 and the desired structure 8 according to step b) of the method. The recesses 6 delimit then at least partially recesses 6 opening onto the direct bonding interface 7. These recesses 6 are positioned so that every point of the bonding interface 7 is at a distance smaller than or equal to a threshold distance comprised between 1.5 and 2.5 cm from an edge 9 of the bonding interface 7.

Figure 3:
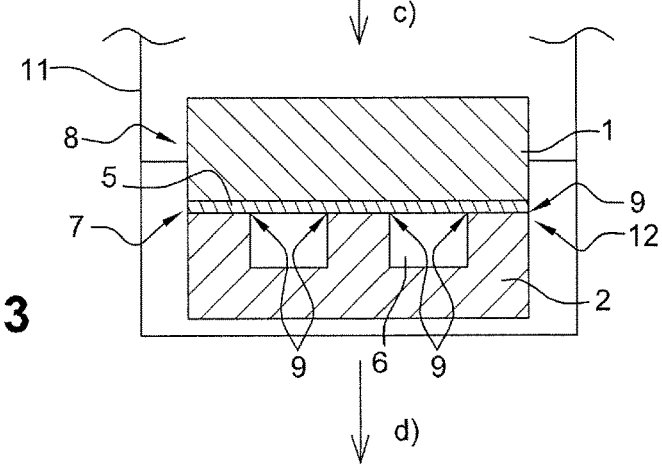
Figure 4:
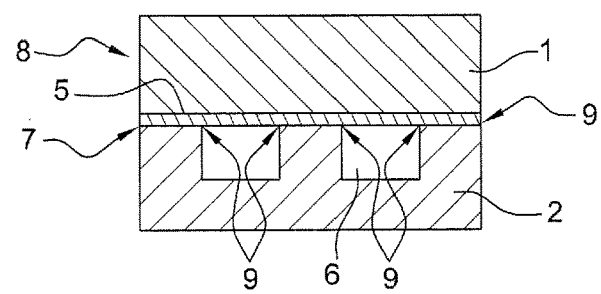

FIG. 3 illustrates a step i) of the method which consists in disposing the thus formed structure 8 in an enclosure 11 comprising a fluid including water molecules which covers the level of the bonding interface 7. When the recesses 6 extend substantially in a plane of the bonding interface 7 as is illustrated in FIG. 8, the recesses 6 open onto a lateral edge 12 of the structure 8 adjacent to the plane of the bonding interface 7. Thus, the recesses 6 communicate with the wet medium contained in the enclosure 11 so that the recesses 6 are filled with a water fluid according to step c) of the method. Thus, the edges 9 of the bonding interface 7 are in contact with water molecules at the periphery of the structure 8 and the recesses 6 delimiting inner edges 9 of the bonding interface 7.

Afterwards, the structure is placed at about 45° C. for 15 days before applying a thermal budget at low temperature, about 200° C., serving as a bonding anneal according to step b) of the method. This thermal budget is carried out directly in the enclosure 11 but according to a variant which is not illustrated, the thermal budget may be applied in a furnace distinct from the enclosure 11. These operations allow obtaining a reinforced bonding energy, for example in the order of 4 J/m² at every point of the bonding interface 7.

According to another possibility which is not illustrated, the two bonding surfaces 3, 4 are plasma-treated before contacting according to step b) of the method and the thermal budget according to step d) is applied at a temperature comprised between about 20 and 250° C., for example at 50° C., for a few hours to several days. Moreover, this thermal budget may be applied at free air when the temperature thereof is higher than or equal to 20° C.

FIGS. 5 to 7 illustrate a variant of the method according to the invention. Recesses 6 have been arranged at both bonding surfaces 3, 4 of the first and second layers 1, 2. A silicon oxide film 5 is deposited over each thus structured surface 3, 4 so as to reproduce the topology of the recesses 6. The distance between the recesses 6 allows ensuring that every point of the bonding interface 7, formed at the subsequent step, is located at distance smaller than or equal to 2 cm from the edges 9 of the bonding interface 7. The recesses 6 of one of the layers of material are filled with the fluid containing the water molecules according to step c) of the method so that, once the surfaces 3, 4 have been brought into contact, for example at ambient pressure, the formed recesses 6 comprise a fluid including water molecules.

The thus formed structure 8 is then placed in an enclosure 11 comprising a fluid covering the level of the bonding interface 7 according to step i) of the method. A heat treatment is applied to the whole bonding interface 7 of water in the enclosure 11 and in the recesses 6 so as to present a temperature of about 90° C. for 1 h.

Afterwards, as is illustrated in FIG. 7, a bonding anneal according to step d) is performed at 250° C. for a few hours, so as to reinforce the bonding energy of the structure 8 at every point of the bonding interface 7.

Figure 9:
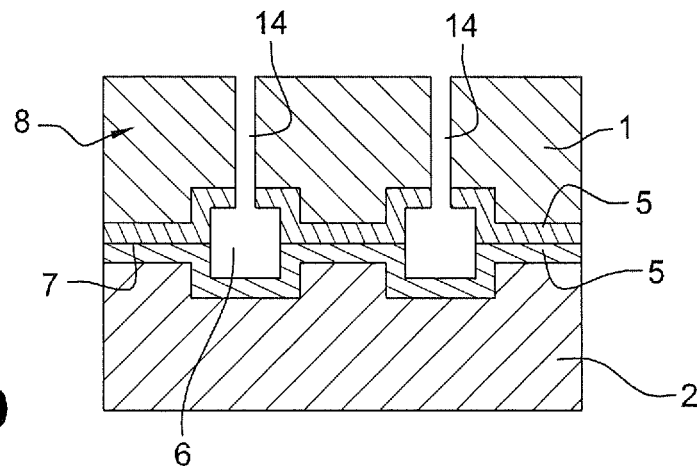
FIG. 9 illustrates a cross-sectional view of a structure obtained according to another variant of the method according to the invention.

FIG. 9 illustrates first and second layers 1, 2 of material whose bonding surfaces 3, 4, each covered with a silicon oxide film 5 have been brought into contact. Hermetic recesses 6 have been formed beforehand at the bonding interface 7 and communication with the exterior of the structure 8 has been made possible by arranging an orifice 14 across the thickness of at least one of the layers 1, 2 of materials. Thus, the recesses 6 may be filled with a fluid including water molecules, such as air including a relative moisture higher than 10% in order to enhance the bonding energy after a bonding anneal performed at 300° C. for a few minutes.

Figure 10:
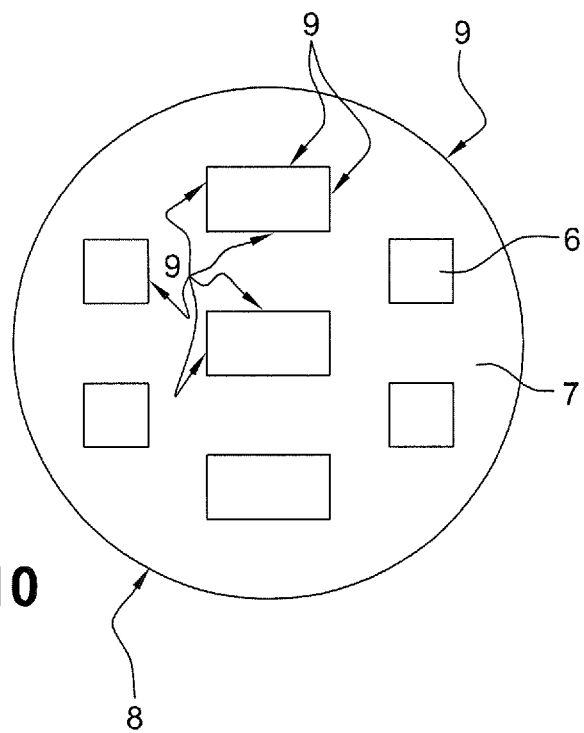
FIG. 10 illustrates a horizontal sectional view of a structure obtained according to still another variant of the method of the invention.

As is illustrated in FIG. 10 by a horizontal section of the structure 8 at its bonding interface 7, the recesses 6 have been arranged so that every point of the bonding interface 7 is located at a distance smaller than or equal to a threshold distance from an edge 9 of the bonding interface 7 capable of communicating with a fluid including water molecules present in a recess 6 or in an enclosure 11 in which the structure 8 is disposed.

Thus, the present invention provides a method for manufacturing a structure 8 including a direct bonding between two layers 1, 2 presenting a high bonding energy which avoids the use of bonding anneal at high temperature and which avoids a step of activating the bonding surfaces 3, 4 by plasma treatment. Thus, the method is inexpensive, presents a reduced cycle time and may be applied to numerous materials.

It goes without saying that the invention is not limited to the variants described above as examples but it encompasses all technical equivalents and variants of the described means as well as their combinations.

The invention claimed is:

1. A method for manufacturing a structure by direct bonding between a first layer of material and a second layer of material, the method comprising:
   (a) providing the first layer and the second layer, each of the first layer and the second layer comprising a bonding surface, at least one of the first and second layers comprising recesses opening at the bonding surface of said at least one layer, and the bonding surface of at least one of the first and second layers being formed at least partially by a silicon oxide film;
   (b) bringing the bonding surface of the first layer and the bonding surface of the second layer into contact so as to provide the structure and create a direct bonding interface between the first layer and the second layer;
   (c) filling at least partially at least one recess with a fluid comprising water molecules;
   (d) setting up the structure in an enclosure comprising a fluid including water molecules, the fluid covering a level of the bonding interface; and
   (e) applying a thermal budget at a temperature between 20° C. and 400° C., thereby enabling performance of a bonding anneal,
   wherein step (c) and step (d) are performed before step (e), and step (d) is performed after step (b).

2. The method according to claim 1, wherein step (a) comprises:
   forming and arranging the recesses in at least one of the first layer and the second layer so that every point of the direct bonding interface is located at a distance less than or equal to a threshold distance from an edge of the direct bonding interface, the edges of the direct bonding interface being delimited, on the one hand by the recesses, and on the other hand by the periphery of the structure.

3. The method according to claim 2, wherein the threshold distance is between 1.5 cm and 2.5 cm.

4. The method according to claim 1, wherein at least one recess extends substantially in a plane of the direct bonding interface so as to open onto a lateral edge of the structure adjacent to the plane of the direct bonding interface.

5. The method according to claim 1, wherein at least one recess is hermetic in the structure.

6. The method according to claim 1, wherein the method further comprises:
   arranging at least one orifice through the thickness of the at least one of the first layer and the second layer so as to connect at least one recess of the at least one of the first layer and the second layer to the opposite surface of the bonding surface of the at least one of the first layer and the second layer.

7. The method according to claim 1, wherein the method further comprises:
   a step (j) of placing the structure at a temperature comprised between 20° C. and 99° C. for a duration between 1 hour and 30 days,
   wherein step (j) is performed before step (e).

8. The method according to claim 1, wherein the application of the thermal budget of step (e) is performed for a duration between a few minutes and several dozens of hours.

9. The method according to claim 1, wherein the fluid including water molecules is formed at least partially by air including a relative moisture higher than 10% or by water in the liquid form.

10. The method according to claim 1, wherein the materials of at least one of the first layer and the second layer are selected from a group consisting of silicon oxides, semiconductor materials, silicon nitrides, alumina, SiOC and diamond.

11. The method according to claim 1, wherein the method further comprises:
    a step of applying a plasma treatment on the bonding surfaces of the first layer and the second layer,
    wherein the step of applying the plasma treatment on the bonding surfaces is performed before step (b).

12. The method according to claim 1, wherein the thermal budget is applied in step (e) at a temperature between 20° C. and 200° C., excluding 200° C.

13. The method according to claim 1, wherein step (d) is performed before step (c).

14. The method according to claim 1, wherein step (d) is performed after step (c).

* * * * *